United States Patent [19]

Hara et al.

[11] Patent Number: 5,444,654
[45] Date of Patent: Aug. 22, 1995

[54] ROM WITH BI-CMOS GATE ARRAYS

[75] Inventors: Hiroyuki Hara, Fujisawa; Yoshinori Watanabe, Yokohama, both of Japan

[73] Assignee: Kabushiki Kaisha Toshiba, Kawasaki, Japan

[21] Appl. No.: 201,091

[22] Filed: Feb. 24, 1994

Related U.S. Application Data

[63] Continuation of Ser. No. 660,053, Feb. 25, 1991, abandoned.

[30] Foreign Application Priority Data

Feb. 26, 1990 [JP] Japan ................ 2-042619

[51] Int. Cl.6 ............ G11C 11/34; G11C 8/00
[52] U.S. Cl. ................ 365/177; 365/189.08; 365/230.03; 365/230.06
[58] Field of Search ........... 365/177, 154, 190, 230.03, 365/230.06, 196, 189.08; 357/43; 307/530; 327/51

[56] References Cited

U.S. PATENT DOCUMENTS

| | | | |
|---|---|---|---|
| 4,821,235 | 4/1989 | Heald | 365/177 |
| 4,829,479 | 5/1989 | Mitsumoto et al. | 365/177 |
| 4,899,308 | 2/1990 | Khan | 365/104 |
| 4,933,899 | 6/1990 | Gibbs | 365/177 |
| 5,119,314 | 6/1992 | Hotta et al. | 357/43 |

FOREIGN PATENT DOCUMENTS

| | | |
|---|---|---|
| 0256904 | 2/1988 | European Pat. Off. |
| 0258715 | 3/1988 | European Pat. Off. |
| 0282702 | 9/1988 | European Pat. Off. |

*Primary Examiner*—Timothy P. Callahan
*Assistant Examiner*—Trong Phan
*Attorney, Agent, or Firm*—Foley & Lardner

[57] ABSTRACT

Disclosed is a semiconductor integrated circuit of a bipolar CMOS gate array type having a plurality of basic cells arranged in a matrix. Each cell comprises MOS transistors as memory cells, a bipolar transistor, a resistance and bit lines, for transferring data stored in the memory cells to the outside. The semiconductor integrated circuit is characterized in that the basic cells are grouped into a plurality of blocks, the bipolar NPN transistor in each block is used as a driver for reading operations of the data stored in the memory cells in each block, and the bit line is kept at a logic state "0" before the reading operations for the memory cells.

5 Claims, 5 Drawing Sheets

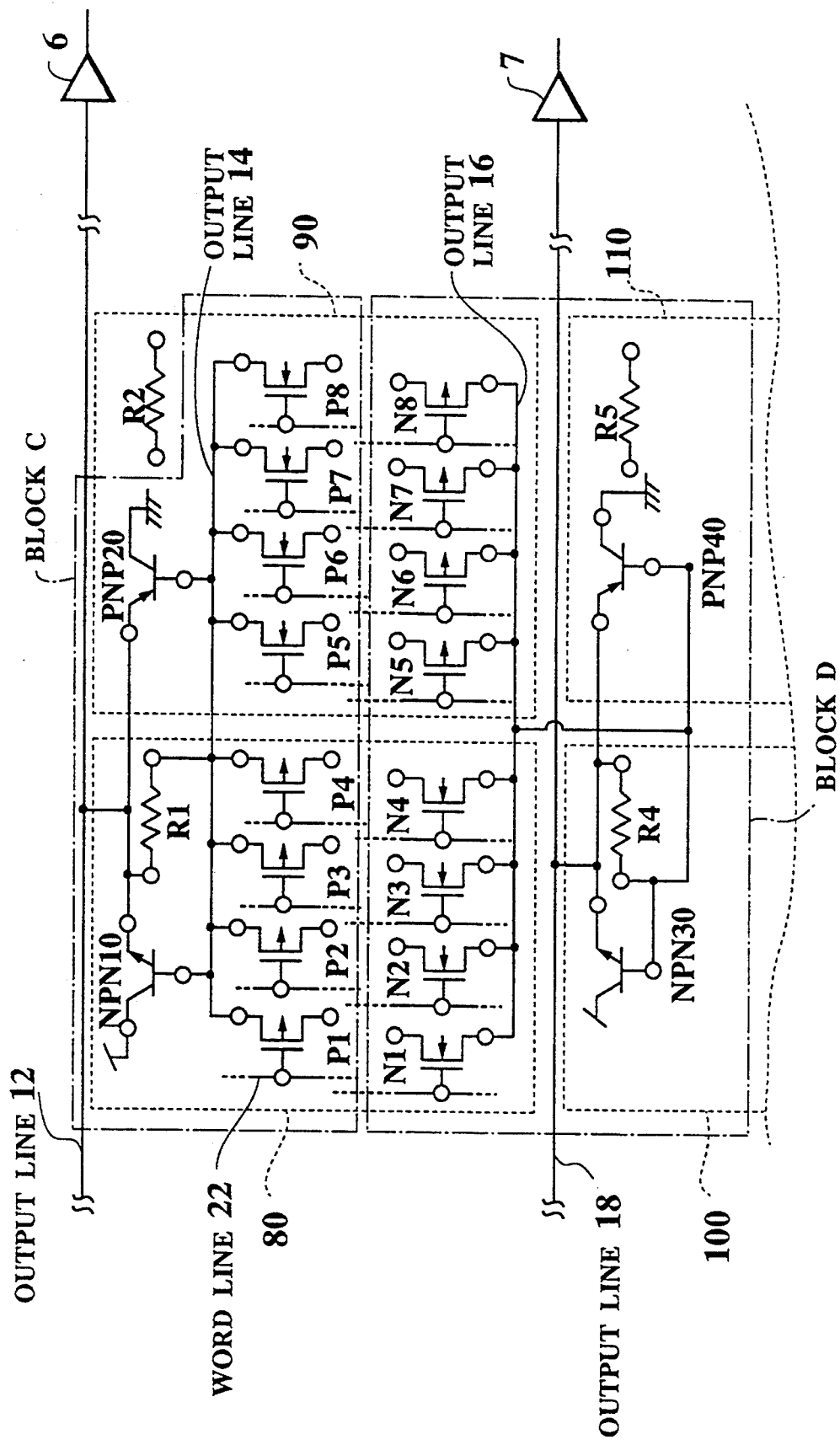

ROM WITH BI-CMOS GATE ARRAYS

This application is a continuation of application Ser. No. 07/660,053, filed Feb. 25, 1991, now abandoned.

BACKGROUND OF THE INVENTION

1. Field of the Invention

This invention relates to a semiconductor integrated circuit, more particularly to the construction of a semiconductor integrated circuit comprising a plurality of bipolar CMOS (Bi-CMOS) gate arrays.

2. Description of the Prior Art

All memory cores in a conventional ROM formed by using bipolar CMOS gate arrays are made up of MOS transistors.

FIG. 1 is part of circuit diagram of a ROM which is made up of the conventional Bi-CMOS gate array. In the same diagram, each of a plurality of memory cells 4 is connected to a word line 5 and an output line i (a bit line 1). The source terminal 4S of the memory cell 4 is connected to a power source $V_{DD}$ (not shown) or a ground for programming. The drain terminal 4D of the memory cell 4 is connected to the output line 1.

When the memory cell 4 is addressed by a Bi-CMOS decoder 3 through a word line 5, data stored therein are read out on the output line 1. The memory cells 4 corresponding one word for word processing are connected to the output line 1.

In the conventional ROM having the construction described above, a Bi-CMOS are used as the decoder 3 or the sense amplifier 2 for high speed operation.

Moreover, because all of the drains of memory cells corresponding to the word for word processing are connected to the output line 1, the loads of the output line 1 becomes so heavy that there is a problem in the prior art that it takes much time to execute a reading operation the memory cells 4. Namely, the operation speed in reading become lower.

FIG. 2 shows reading forms for access time for the reading operation of the conventional ROM comprising the Bi-CMOS gate arrays. The number of the memory cells connected to the output line 1 is the same number of the memory cells corresponding to one word for word processing, as shown in FIG. 1.

In the same diagram, when an output level $L_o$ of the output line 1 exceeds a threshold level Ls of the sense amplifier 2, a reading operation of the data stored in the ROM is started (T0). The total access time of the reading operation for the ROM is given as follows:

$$T_{CMOS} = T_E - T_S$$

where the end time of the reading operation is $T_E$ and the time that an address signal is given to the Bi-CMOS decoder 3 is Ts.

In the ROM having the construction described above, as the memory cells belonging to the word line are connected to the output line 1 as loads, there is the problem that the rise-time $(T_S - T_o)$ of the reading operation of the memory cell 4 requires too much time.

FIG. 3 shows a basic cell as a unit cell of the Bi-CMOS gate array. In the same diagram, reference characters N1 to N4 designate N-type MOS transistors, P1 to P4 are P-type MOS transistors, NPN is a bipolar transistor, and R is a resistance. The Bi-CMOS gate array widely used is made up of a plurality of the basic cells arranged on a large-scale integrated (LSI) device, which are connected to one another by wiring. However, the bipolar transistor in the basic cell is not used in the conventional ROM so that the utilizable efficiency of the basic cell is lowered.

To summarize the problem of the conventional ROM implementing the Bi-CMOS gate arrays, a plurality of memory cells are connected to one output line so that the access time of the memory cell in the ROM is slowed and the degree of integration of the ROM becomes low because the Bi-transistor NPN in the basic cell has not been used.

SUMMARY OF THE INVENTION

It is therefore an object of the present invention to provide a ROM with Bi-CMOS gate arrays capable of having a shorter access time and a high integration degree.

In a preferred embodiment according to the present invention, a semiconductor integrated circuit of a bipolar CMOS gate array type has a plurality of basic cells arranged in a matrix, each of which comprise bipolar MOS transistors as memory cells, a bipolar transistor, and a resistor and output lines for transferring to the outside data stored in the memory cells, the semiconductor integrated circuit is characterized in that the basic cells are grouped into a plurality of blocks, the bipolar transistor in each block is used as a driver for reading operations of data stored in the memory cells in each block, and the output line is kept at a predetermined electrical level before the reading operations for the memory cells.

in the semiconductor integrated circuit according to the present invention, the memory cells of the predetermined numbers are grouped into one block. The Bi-transistor provided in the basic cell as the memory cell in the block is used as a driver for driving the memory cells in the block. The number of memory cells driven by one driver is optimized so that a high speed operation for reading the data stored in the memory cells can be carried out. Moreover, the bipolar transistor in the Bi-CMOS gate array, which is not used in the conventional ROM, is utilized as the driver so that the high degree of integration for a ROM can be achieved.

The object, features and advantages of the present invention will be more apparent from the following description of a preferred embodiment, taken in conjunction with the accompanying drawings.

BRIEF DESCRIPTION OF THE DRAWINGS

FIG. 6 shows a construction of a semiconductor integrated circuit (ROM) of another embodiment according to the present invention, in which the basic cells, as shown in FIG. 3, are used.

DETAILED DESCRIPTION OF THE EMBODIMENTS

Hereinafter, embodiments of the present invention will be explained with reference to the attached drawings.

in a first embodiment, the construction of a ROM implemented in a Bi-CMOS gate array is explained, similar to the conventional ROM described in the description of the prior art.

Figure 3:
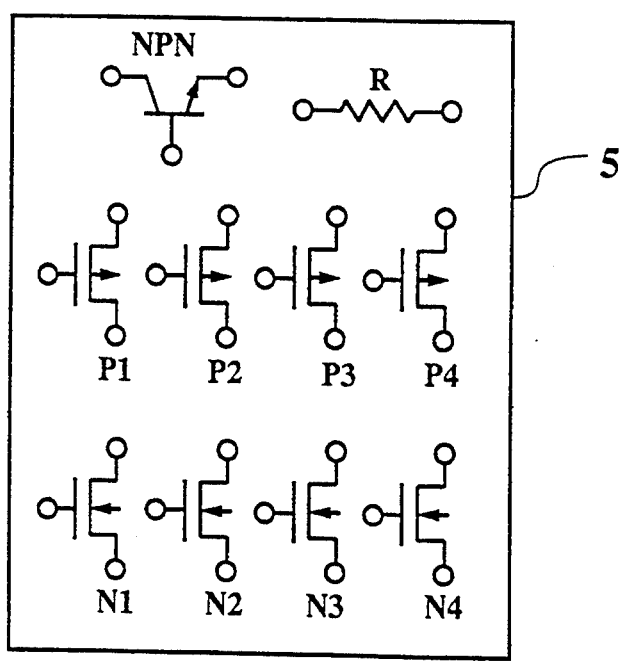
FIG. 3 shows a construction of a basic cell provided in a semiconductor integrated circuit (ROM)
Figure 4:
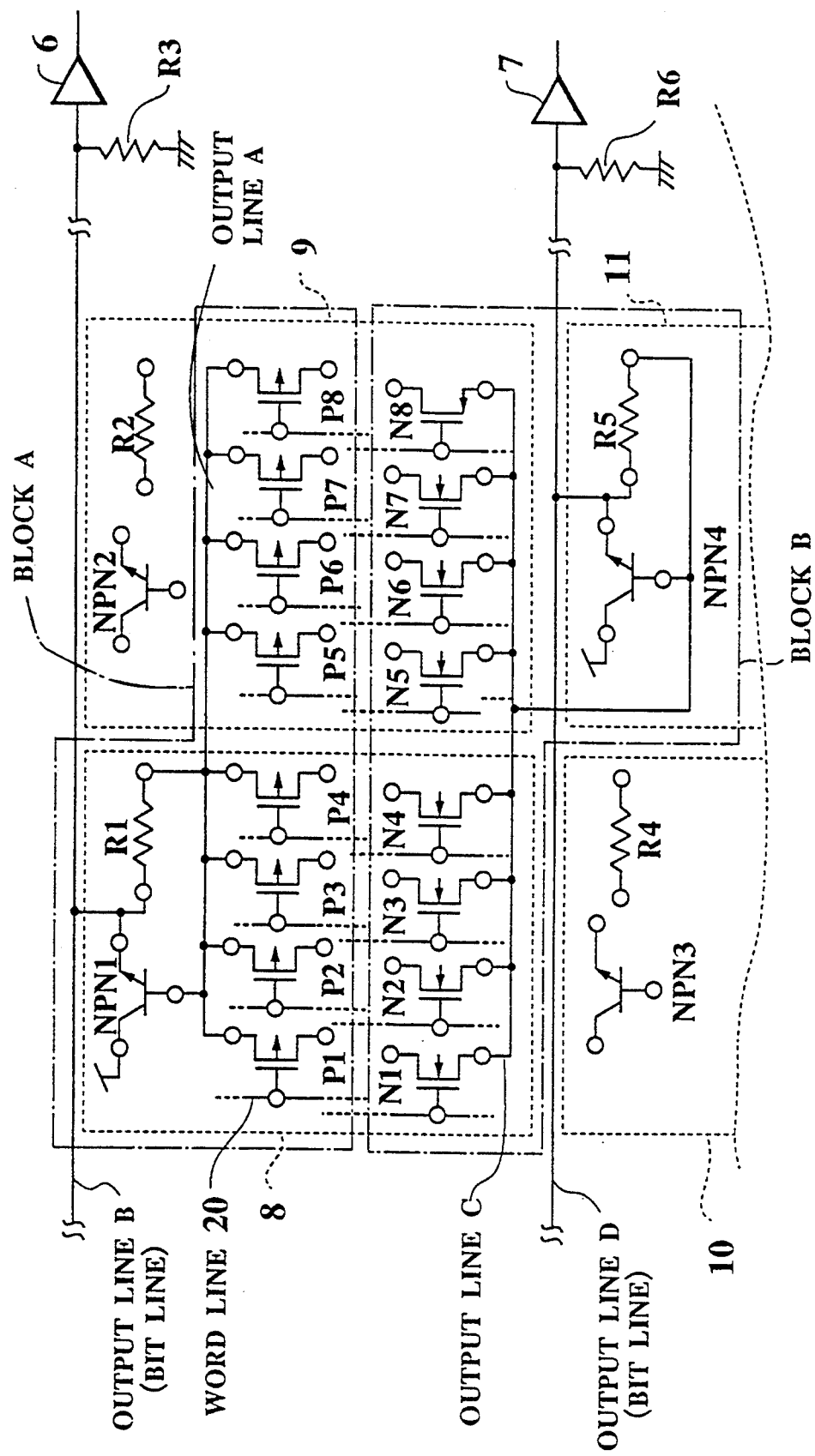
FIG. 4 shows a construction of a semiconductor integrated circuit (ROM) of an embodiment according to the present invention, in which the basic cells, as shown in FIG. 3, are used.

FIG. 4 shows a construction of the semiconductor integrated circuit or ROM. In the same diagram, reference numbers 8, 9, 10, and 11 designate the basic cells, as shown in FIG. 3. Reference numbers 6 and 7 denote sense amplifiers connected to a bipolar transistor NPN1 through an output line B (or a bit line) and data stored in memory cells P1 to P8 and N1 to N8 arc read out to outside thereof through the sense amplifiers 6 and 7.

The memory cells P1 to P8 and N1 to N8 comprise PMOS transistors and NMOS transistors, respectively, and the sources of the PMOS transistors P1 to P8 are connected to the output line A. The output line A is also connected to the base of the bipolar transistor NPN1. The emitter of the bipolar transistor NPN1 is connected to the output line B through the resistor R1 in the basic cell 8. Similarly, the sources of the NMOS transistors N1 to N8 in the basic cells 8 and 9 as the memory cell are connected to an output line C which is connected to the base of a bipolar transistor NPN4 in a basic cell 11. In addition, the output line C is also connected to the base of the bipolar transistor NPN 4 through a resistor R5. Each drain of the PMOS transistors P1 to P8 is connected to a ground potential or a power source $V_{DD}$ for programming.

In the ROM of the first embodiment having the construction described above, a plurality of the basic cells are arranged in a matrix so as to obtain a Bi-CMOS gate array.

Moreover, eight MOS transistors, for example the PMOS transistors P1 to P8 in the two basic cells 8 and 9, are grouped into one block A, because it is preferable to separate the PMOS transistors P1 to P8 and NMOS transistors N1 to N8 for optimizing the operations of the sense amplifiers 6 and 7. The PMOS transistors P1 to P4 in the basic cell 8 and the PMOS transistors P5 to P8 in the basic cell 9 are grouped into the block A. Similarly, the NMOS transistors N1 to N4 in the basic cell 8 and the NMOS transistors N5 to N6 in the basic cell 9 are grouped into a block B in the embodiment.

Although the operating speed of the bipolar transistor NPN1 as a driver used for reading operations of the memory cells P1 to P8 in the block A is very high, the bipolar transistor NPN1 controls only the eight PMOS transistors P1 to P8 belonging to the block A, so that high speed operation of the semiconductor integrated circuit can be achieved. In the first embodiment as shown in FIG. 4, the bipolar transistor NPN2 and resistance R2 of basic cell 9 are not needed for proper operation of block A, and are shown as unutilized. The bipolar transistor NPN3 and resistance R4 of basic cell 10 are not needed for proper operation of block B, and are also shown as unutilized.

Figure 1:
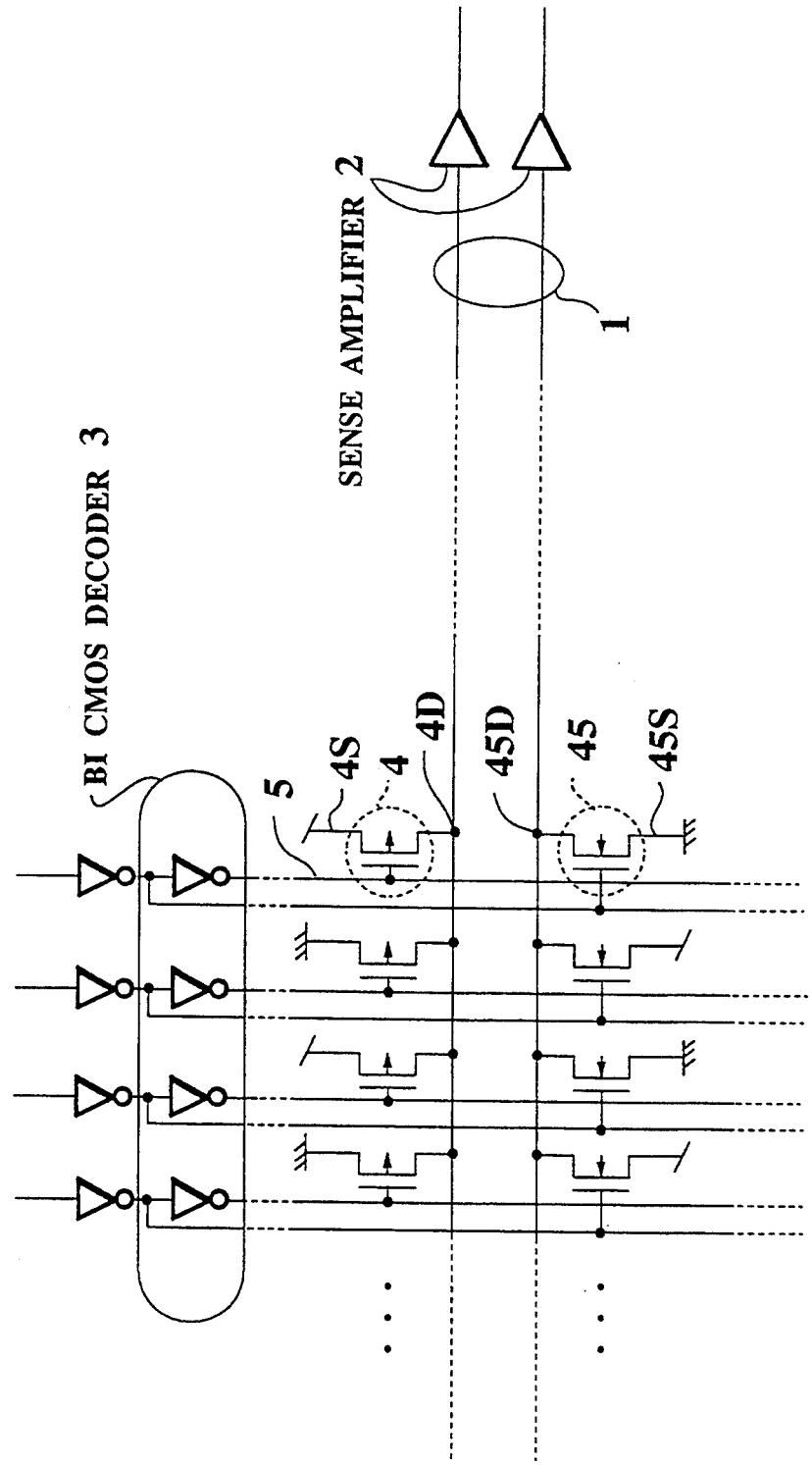
FIG. 1 shows part of construction of a semiconductor integrated circuit (ROM) conventionally used.
Figure 2:
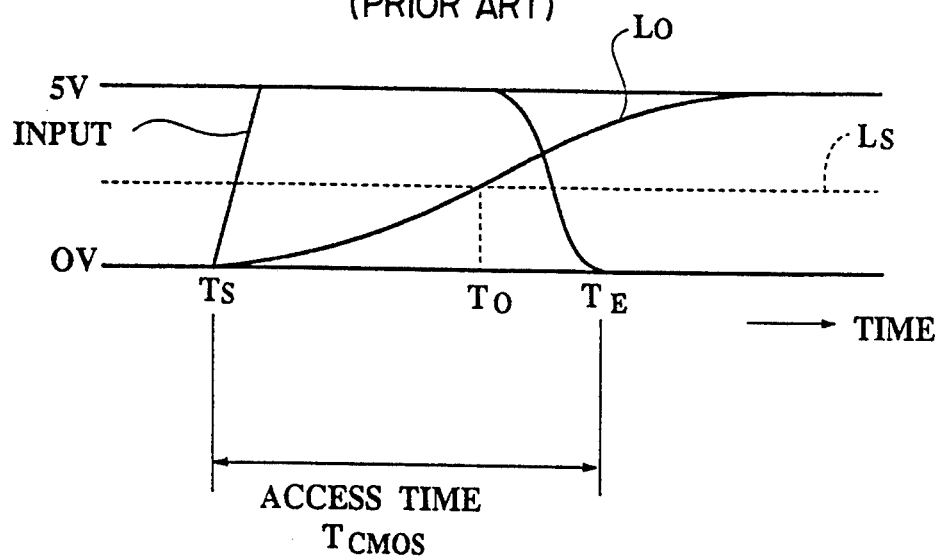
FIG. 2 shows waveforms of reading operations in the semiconductor integrated circuit (ROM), as shown in FIG. 1.
Figure 5:
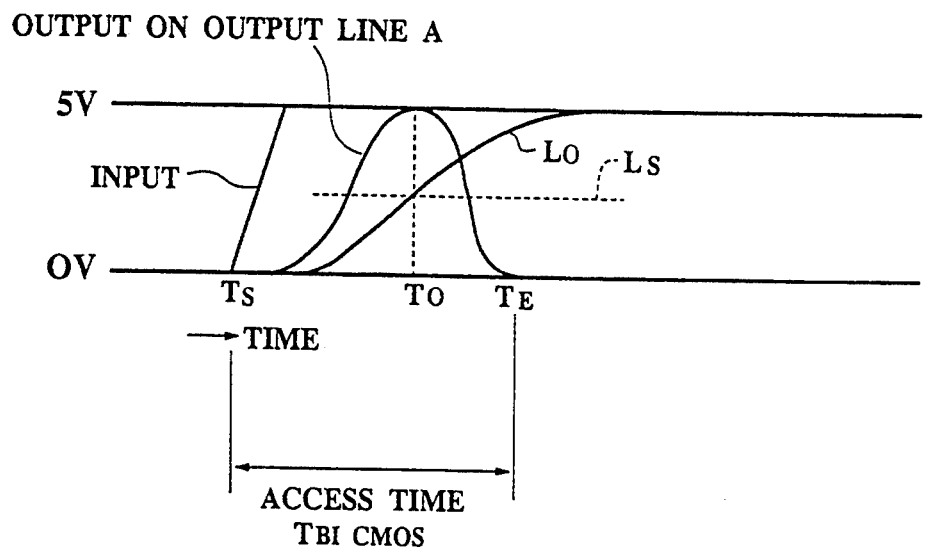
FIG. 5 are wave forms for reading operations of the semiconductor integrated circuit (ROM) as shown in FIG. 4.

FIG. 5 shows waveforms of the reading operation of the semiconductor circuit according to the present embodiment. When compared to the access time ($T_{CMOS}$) of the conventional semiconductor integrated circuit, as shown in FIG. 2, the access time $T_{BICMOS}$ for the reading operation of the ROM according to the first embodiment is less than the access time $T_{CMOS}$ of the ROM as shown in FIG. 2 ($T_{CMOS} > T_{BICMOS}$).

In the present embodiment, the bipolar transistor NPN1 is used as the driver so as to handle the memory cells P1 to P8 in the block A.

The output line B or the bit line is usually grounded (pulled down) through the resistance RS.

In the ROM of the present embodiment described above, for example, when the PMOS transistor P1 whose data is "1" (high level) is selected by the word line 20, the level of the base of the driver NPN1 becomes a logic state "1". Consequently the level of the output line B becomes also "1". Thus, the data stored in the PMOS transistor P1 is transferred to the sense amplifier 6 through the driver NPN1. Next, the level of the output line B is pulled down to a logic state "0" (low level) by a pull-down resistance as a precharge operation for next reading operation. Conversely, when the PMOS transistor P1 whose data is "0" is selected, the driver NPN1 is not operated or in OFF state, so that the level of the output line B is kept in the low state "0". Then, the output line B is also pulled down to the low level "0" by the pull down resistance RS before the next reading operation is started. In the embodiment, the precharge operation for setting the output line B at the low level "0" for the next reading operation is required between two reading operations. In such a case, the reading operation should be carried out in synchronization with the precharge operation.

Figure 7:
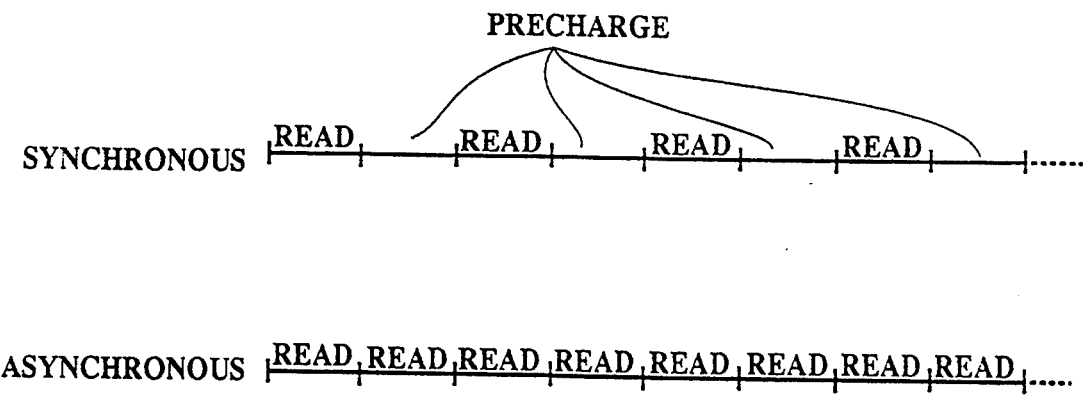
FIG. 7 are timing charts for reading operations, in which the upper timing chart is for a ROM of the first embodiment, and the lower timing chart is for a ROM of a second embodiment, according to the present invention.

FIG. 7 shows two timing charts of reading operations, in which the upper timing chart (SYNCHRONOUS) is for the Bi-CMOS ROM of the first embodiment and the lower timing chart (ASYNCHRONOUS) is for a Bi-CMOS ROM according to a second embodiment, as described below in detail.

Next, we will now be explained the second embodiment according to the present invention.

FIG. 6 shows a construction of a semiconductor integrated circuit of the second embodiment, in which the plural basic cells 80, 90, 100, and 110 are used. In the same diagram, NPN10, PNP20, NPN30, and PNP40 are drivers for reading operations of memory cells P1 to P8 and of memory cells N1 to N8. Namely, the memory cells P1 to P8 are grouped into the block C, in which data are read out by the combination of the drivers NPN10 and PNP20 to the sense amplifier 6 through an output line 12.

In addition, the memory cells N1 to N8 are grouped into the block D in which data are read out by the combination of the drivers NPN30 and PNP40 to the sense amplifier 7 through an output line 18.

When data stored in the PMOS transistor P1 is in a logic state "1", the driver NPN10 is switched on so that the level of the output line 12 becomes "1". At the same time, the driver PNP20 is switched off. While, when the data stored in the PMOS transistor P1 is "0", the driver PNP20 is switched on so that the level of the output line 12 becomes "0". Simultaneously, the driver NPN10 is switched off.

The drivers such as the bipolar transistor NPN 30 or PNP 40 in the block D shown in FIG. 6 can be similarly operated for the data stored in the memory cells N1 to N8.

In the second embodiment described above, the two bipolar transistors NPN10 and PNP20 in the block C are used instead of the bipolar transistor NPN1 in the block A in the first embodiment which act as the drivers for the reading operations of the memory cells P1 to P8. The output level of the block C has two logical levels, "1" (high) and (low), provided by the drivers NPN10 and PNP20. Accordingly, as shown by the lower timing chart in FIG. 7, the semiconductor integrated circuit (ROM) of the second embodiment requires no precharge operation so that the higher reading cycle time can be achieved. In the second embodiment as shown in FIG. 6, the resistance R2 of basic cell 90 and the resistance R5 of basic cell 110 are not needed for proper operation of blocks C and D, respectively, and are shown in FIG. 6 as unutilized.

Moreover, the resistances R3 and R6 used in the ROM of the first embodiment (shown in FIG. 4) are not necessary because precharge operation for the output line 12 is not required.

The scope of this invention is not limited to the embodiments described above, but includes many variations that will be obvious to one skilled in the art. For example, the number of the memory cells per block may be another number other than eight.

What is claimed is:

1. A semiconductor integrated circuit of the gate array type, comprising:
   a plurality of basic cells arranged in a matrix, each of the basic cells comprising a plurality of MOS transistors as memory cells, a bipolar transistor, and a resistance, said bipolar transistor having a base, emitter and collector;
   a plurality of bit lines for reading out data from the memory cells in a row; and
   a plurality of word lines for selecting the memory cells in a column,
   wherein a predetermined number of the basic cells are grouped into one memory block,
   each memory block containing a plurality of MOS transistors of the same conductivity type, and not containing any MOS transistors of any other conductivity type, the bipolar transistor and the resistance in each basic cell is used for each memory block as a driver for reading out data from the memory cells in the same memory block,
   the memory cells in the same memory block are connected to the base of the bipolar transistor and one side of the resistance, and
   the emitter of the bipolar transistor is connected to the other side of the resistance and the bit line through which data from the memory cells is transferred to outside of the semiconductor integrated circuit.

2. A semiconductor integrated circuit of the gate array type, comprising
   a plurality of basic cells arranged in a matrix, each of the basic cells comprising a plurality of MOS transistors as memory cells, a bipolar transistor, and a resistance, said bipolar transistor having a base, emitter and collector;
   a plurality of bit lines for reading out data from the memory cells in a row; and
   a plurality of word lines for selecting the memory cells in a column,
   wherein a predetermined number of the basic cells are grouped into one memory block,
   each memory block containing a plurality of MOS transistors of the same conductivity type, and not containing any MOS transistors of any other conductivity type, the bipolar transistor and the resistance in each basic cell is used for each memory block as a driver for reading out data from the memory cells in the same memory block,
   the memory cells in the same memory block are connected to the base of the bipolar transistor and one side of the resistance, and
   the emitter of the bipolar transistor is connected to the other side of the resistance and the bit line through which data from the memory cells is transferred to outside of the semiconductor integrated circuit,
   and wherein the electrical level of the bit lines are at a logic state "0" before the reading operation.

3. A semiconductor integrated circuit of the gate array type comprising:
   a plurality of basic cells arranged in matrix, each of the basic cells comprising:
   a plurality of MOS transistors as memory cells;
   a bipolar transistor of the NPN type or the PNP type;
   a resistance;
   a plurality of bit lines for reading out data from the memory calls in a row; and
   a plurality of word lines for selecting the memory cells in a column;
   wherein;
   a predetermined number of the basic cells are grouped into one memory block,
   the bipolar transistors of the NPN type and the PNP type and the resistance in adjacent basic cells are used for each memory block as a driver for reading out data from the memory cells in the same memory block,
   the memory cells in the memory group are connected to the base side of the bipolar transistors of NPN type and PNP type and the one side of the resistance, and
   the emitter of the bipolar MOS transistor of NPN type is connected to the emitter of the bipolar transistor of PNP type and the other side of the resistance and the bit line through which data from the memory cells in the same memory block is transferred to outside of the semiconductor integrated circuit.

4. A semiconductor integrated circuit according to claim 3, wherein a higher electrical level "1" is transferred to the bit line by the emitter of the bipolar transistor of the NPN type when the memory cell stores the higher electrical level "1".

5. A semiconductor integrated circuit of the gate array type, comprising:
   a plurality of basic cells arranged in a matrix, each of the basic cells comprising a plurality of N-type MOS transistors and a plurality of P-type MOS transistors as memory cells, a resistance, and a bipolar transistor having a base, an emitter, and a collector;
   a plurality of bit lines for reading out data from the memory cells in a row; and
   a plurality of word lines for selecting the memory cells in a column, wherein
   said semiconductor integrated circuit is formed as a plurality of memory blocks, each of said memory blocks including parts of a predetermined number of basic cells, each of said memory blocks containing at least one of said bipolar transistors, at least one of said resistances, and a plurality of either said N-type MOS transistors or said P-type MOS transistors, but not both, said at least one of said bipolar transistors and resistances in each of said memory blocks is used as a driver for reading out data from the memory cells in each of said memory blocks, the memory cells in each of said memory blocks are connected to the base of the bipolar transistor and one side of the resistance, and the emitter of the bipolar transistor is connected to the other side of the resistance and the bit line through which data from the memory cells is transferred to outside of the semiconductor integrated circuit.

* * * * *